United States Patent
Yoshino et al.

(10) Patent No.: US 7,049,920 B2
(45) Date of Patent: May 23, 2006

(54) OPEN MAGNET DEVICE AND MAGNETIC RESONANCE IMAGING APPARATUS COMPRISING IT

(75) Inventors: Hitoshi Yoshino, Kashiwa (JP); Fred Goldie, Worthing (GB)

(73) Assignee: Hitachi Medical Corporation, Tokyo (JP)

( * ) Notice: Subject to any disclaimer, the term of this patent is extended or adjusted under 35 U.S.C. 154(b) by 17 days.

(21) Appl. No.: 10/362,933

(22) PCT Filed: Aug. 27, 2001

(86) PCT No.: PCT/JP01/07304

§ 371 (c)(1),
(2), (4) Date: Feb. 27, 2003

(87) PCT Pub. No.: WO02/17783

PCT Pub. Date: Mar. 7, 2002

(65) Prior Publication Data
US 2003/0173964 A1   Sep. 18, 2003

(30) Foreign Application Priority Data
Aug. 28, 2000  (JP) .............................. 2000-258055

(51) Int. Cl.
*H01F 3/00* (2006.01)
*H01F 6/00* (2006.01)
*H01F 7/00* (2006.01)
*G01V 3/00* (2006.01)

(52) U.S. Cl. ..................... 335/301; 335/299; 335/296; 335/216; 324/318; 324/319

(58) Field of Classification Search ................ 324/307, 324/309, 318–322, 315; 335/216, 296, 297, 335/301, 300; 62/51.1, 47.1; 505/211, 163
See application file for complete search history.

(56) References Cited

U.S. PATENT DOCUMENTS

| | | | | |
|---|---|---|---|---|
| 3,358,463 A | * | 12/1967 | Hawkins et al. | 62/51.1 |
| 4,721,934 A | * | 1/1988 | Stacy | 335/300 |
| 4,771,256 A | * | 9/1988 | Laskaris et al. | 335/301 |
| 4,800,354 A | * | 1/1989 | Laskaris | 335/216 |
| 4,837,541 A | * | 6/1989 | Pelc | 335/300 |
| 4,848,103 A | * | 7/1989 | Pelc et al. | 62/51.1 |
| 4,895,831 A | * | 1/1990 | Laskaris | 505/163 |
| 4,902,995 A | * | 2/1990 | Vermilyea | 505/211 |

(Continued)

FOREIGN PATENT DOCUMENTS
EP   0883143 A1 * 12/1998

(Continued)

*Primary Examiner*—Diego Gutierrez
*Assistant Examiner*—Tiffany A. Fetzner
(74) *Attorney, Agent, or Firm*—Antonelli, Terry, Stout and Kraus, LLP

(57) ABSTRACT

In a superconductive magnet device comprising upper and lower vacuum vessels coupled by a coupling conduit, the upper and lower vacuum vessels 9 and the coupling conduit 24 coupling them are made of a high electric-resistance material so that the magnetic flux of gradient magnetic field coils reaches the upper and lower pair of a second heat shields 8 and a coupling conduit 23 coupling the pair of the second heat shields 8. The coupling conduit 23 coupling the upper and lower pair of the second heat shields 8 is provided with a slit (cut) 41 extending in the vertical direction so that no eddy currents occur and thus eddy currents generated asymmetrically in the coupling conduit 23 are reduced. Artifacts caused by asymmetrical eddy currents can by reduced in an MRI apparatus using such a magnet device.

23 Claims, 6 Drawing Sheets

U.S. PATENT DOCUMENTS

| | | | |
|---|---|---|---|
| 4,908,580 A * | 3/1990 | Yamada et al. | 313/62 |
| 4,924,198 A * | 5/1990 | Laskaris | 505/211 |
| 4,935,714 A * | 6/1990 | Vermilyea | 505/211 |
| 5,194,810 A * | 3/1993 | Breneman et al. | 324/319 |
| 5,220,800 A * | 6/1993 | Muller et al. | 62/51.1 |
| 5,278,502 A * | 1/1994 | Laskaris et al. | 324/318 |
| 5,280,247 A * | 1/1994 | DeMeester et al. | 324/318 |
| 5,379,600 A * | 1/1995 | Moritsu et al. | 62/47.1 |
| 5,414,399 A * | 5/1995 | Breneman et al. | 335/301 |
| 6,437,672 B1 * | 8/2002 | Takeshima et al. | 335/216 |
| 2003/0173964 A1 * | 9/2003 | Yoshino et al. | 324/307 |

FOREIGN PATENT DOCUMENTS

JP  05-335137  * 12/1993

* cited by examiner

OPEN MAGNET DEVICE AND MAGNETIC RESONANCE IMAGING APPARATUS COMPRISING IT

TECHNICAL FIELD

The present invention relates to a magnet device used for a magnetic resonance imaging apparatus (hereinafter referred as "MRI apparatus"). In particular, it relates to a technique for suppressing eddy currents produced within the magnet device by gradient magnetic field coils of an MRI apparatus.

RELATED ART

A conventional MRI apparatus is equipped with a static magnetic field magnet for generating a static magnetic field, gradient magnetic field coils for generating gradient magnetic fields and an RF coil, and applies RF pulses produced by the RF coil to a subject under examination (e.g., a patient) placed in the static and gradient magnetic fields to excite atomic nuclear spins, and detects NMR signals emitted by the spins to produce tomograms of the subject.

Such MRI apparatuses are often equipped with a superconductive magnet as the static magnetic field magnet. While a superconductive magnet is typically a solenoid type magnet that generates a magnetic field in the direction of the body axis of the patient, an open type has been also developed in recent years, which facilitates interventional MRI (IVMR) using an MRI apparatus for monitoring surgical operations and so forth, and relieves the subject (patient) from a sense of confinement. In the open type magnet, a pair of superconductive magnets is disposed vertically so as to define a space where the patient is placed, and the upper and lower superconductive magnets are housed in vacuum vessels interconnected by coupling conduits. In this type of superconductive magnet device, the gradient magnetic field coils and RF coil are disposed in the vicinity of the vacuum vessels including the upper and lower superconductive magnets.

In such a conventional superconductive magnet device, materials of low electric resistance such as aluminum alloy have been used as the material for the vacuum vessels and the coupling conduits for connecting the vacuum vessels, in view of considerations such as strength, sealing property and cost. As a result, eddy currents are generated in the vacuum vessels and coupling conduits upon operation of the gradient magnetic field coils. Further, the vacuum vessels and coupling conduits include heat-shield plates that are kept at an extremely low temperature such as 20K or 80K in order to intercept exterior heat. Since such a heat shield plate is made of a material of good heat conductivity and low electric resistance, the problem of generation of eddy currents also arises in these plates as in the vacuum vessels.

In some superconductive magnets, as shown in FIG. 9, in which the z axis lies in the vertical direction and the x and y axes lie in the directions orthogonal to the vertical direction, coupling conduits 24 vertically connecting the vacuum vessels 9 are installed asymmetrically with respect to the x axis in order to facilitate access to a measurement space. In superconductive magnets of this type, eddy currents generated in the coupling conduit portions 24 due to changes in magnetic fields generated by the gradient magnetic field coils are asymmetrical with respect to the x-axis (in the y direction). The asymmetrical eddy currents cause artifacts in images produced by the MRI apparatus and degrades image quality. Such asymmetrical eddy currents cannot be corrected by adjusting the current waveform of the magnetic field generating unit.

Therefore, an object of the present invention is to reduce degradation of images due to the asymmetrical eddy currents generated in a magnet device of an MRI apparatus, especially in a superconductive magnet.

DISCLOSURE OF THE INVENTION

In order to attain the aforementioned object, a magnet device of the present invention comprises:

a pair of vacuum vessels disposed across a space in a vertical direction that is an arbitrarily defined direction, cylindrical vacuum vessel coupling means for vertically coupling the inner spaces of said pair of vacuum vessels, and a pair of magnetic field generating means each of which is disposed in one of the pair of the vacuum vessels and includes a material having superconductivity, wherein the pair of vacuum vessels and the vacuum vessel coupling means are made of a material having a high electric resistance.

In one embodiment of the magnet device according to the present invention, in which the pair of vacuum vessels and the vacuum vessel coupling means are made of a high electric-resistance material as aforementioned, the magnet device further comprises at least one pair of heat shields disposed inside the pair of vacuum vessels and cylindrical heat shield coupling means for vertically coupling the pair of heat shields through the space surrounded by the vacuum vessel coupling means, wherein the heat shield coupling means have slits exhibiting a high electric-resistance property and extending continuously or intermittently in the vertical direction. The term "exhibiting a high electric-resistance property" includes the case where a high electric-resistance is exhibited due to an air gap at the slit portion and the case where a high electric-resistance is exhibited due to a high electric-resistance material covering the slit portion.

According to this embodiment, generation of asymmetric eddy currents in the vacuum vessels and vacuum vessel coupling means can be prevented. Particularly in the case that the heat shield coupling means have continuous or intermittent slits, no current that would be a cause for generation of asymmetric eddy currents in the heat shields flows in the heat shield coupling means. The slit portion is preferably positioned at least on the center side of the heat shield coupling means in the anterior and posterior direction and in the transverse (right and left) direction (that is, on the measurement space side).

In a second embodiment of the magnet device according to the present invention, in which the pair of vacuum vessels and the vacuum vessel coupling means are made of a high electric-resistance material as aforementioned, the magnet device further comprises at least one pair of heat shields disposed inside the pair of vacuum vessels and cylindrical heat shield coupling means for vertically connecting the heat shields through the space surrounded by the vacuum vessel coupling means, wherein the heat shields have holes opening into the inner space of the heat shield coupling means and recesses having the same shape as those of the holes in positions symmetrical to the holes.

By symmetric positions is meant that the positions are symmetrical with respect to the center axis in the anterior and posterior direction and with respect to the center axis in the transverse (right and left) direction of the heat shields. Provision of the recesses in such positions, which are electrically equivalent to the holes, reduces asymmetry of eddy currents caused by presence of the holes.

According to the first and second embodiments of the present invention, the problem of asymmetric eddy currents can be solved not on the vacuum vessel side, which is required to meet a severer condition of high sealing, but on the heat shield side.

In the magnet device of a third embodiment of the present invention, the magnet device comprises: a pair of vacuum vessels disposed across a space in a vertical direction that is an arbitrarily defined direction, cylindrical vacuum vessel coupling means for vertically coupling the inner spaces of said pair of vacuum vessels, and a pair of magnetic field generating means each of which is disposed in one of the pair of the vacuum vessels and includes a material having superconductivity, wherein the vacuum vessel coupling means have slit portions extending continuously or intermittently in the vertical direction and members for covering the slit portions to maintain the vacuum vessels in a vacuum state.

In a fourth embodiment of the magnet device according to the present invention, the magnet device comprises: a pair of vacuum vessels disposed across a space in a vertical direction that is an arbitrarily direction, cylindrical vacuum vessel coupling means for vertically connecting the inner spaces of said pair of vacuum vessels, and a pair of magnetic field generating means each of which is disposed in one of the pair of vacuum vessels and includes a material having superconductivity, wherein the vacuum vessels have holes opening into the inner space of the vacuum vessel coupling means and recesses having the same shape as those of the holes in positions symmetrical to the holes. Here too, "symmetrical position" means that the positions are symmetrical with respect to the center axis in the anterior and posterior direction and with respect to the center axis in the transverse direction of the vacuum vessel.

According to the third and fourth embodiments, the generation of asymmetric eddy currents in the vacuum vessels and the coupling means thereof is prevented. In this case too, the slit portion of the vacuum vessel coupling means is preferably provided at least on the center side in the anterior and posterior direction and in the transverse direction of the heat shields (that is, on the measurement space side).

In a fifth embodiment of the magnet device according to the present invention, the magnet device has a pair of vacuum vessels and vacuum vessel coupling means made of a high electric-resistance material as aforementioned, and further comprises at least one pair of heat shields disposed inside the pair of vacuum vessels and cylindrical heat shield coupling means for vertically connecting spaces surrounded by the vacuum vessel coupling means, wherein the heat shield coupling means have slit portions exhibiting a high electric resistance and extending continuously or intermittently in the vertical direction, and the heat shields have holes opening into the inner space of the heat shield coupling means and recesses having the same shape as those of the holes in positions symmetrical to the holes.

Further, a magnet device of the present invention comprises: a pair of magnets disposed across a space in a vertical direction that is an arbitrarily defined direction for generating a static magnetic field, and supporting columns for coupling the magnets, wherein the columns have slit portions extending continuously or intermittently in the vertical direction.

In this magnet device, the columns may be hollow. The magnets are provided with covers for covering the magnets and the covers have holes opening into the inner space of the columns and recesses having the same shape as those of the holes in positions symmetrical to the holes.

An MRI apparatus of the present invention comprises the aforementioned magnet device as static magnetic field generating means. Typically, the MRI apparatus of the present invention comprises static magnetic field generating means for generating a static magnetic field in a space where a subject (e.g., patient) is placed, gradient magnetic field generating means for generating gradient magnetic fields in the space, a transmitting unit for applying an RF magnetic field to the subject, a detecting unit for detecting NMR signals emitted from the subject, a signal processor for processing the NMR signals to produce images or spectra of the subject, wherein the static magnetic field generating means is a magnet device according to the present invention.

According to the present invention, asymmetric eddy currents can be reduced without need for a special correcting coil or other means for correcting asymmetric eddy currents or means for reducing leakage of magnetic flux from the gradient magnetic field coil. Since generation of spatially asymmetric eddy currents in the magnet device can be thus prevented effectively, deterioration of images due to eddy currents can be minimized in the MRI apparatus employing the magnet device according to the present invention.

PREFERRED EMBODIMENTS OF THE PRESENT INVENTION

Preferred embodiments of the present invention will now be explained.

The general structure of a superconductive magnet device of an MRI apparatus to which the present invention can be applied, and the configuration of the magnet device, gradient magnetic field coils and RF coils will be explained first.

Figure 1:
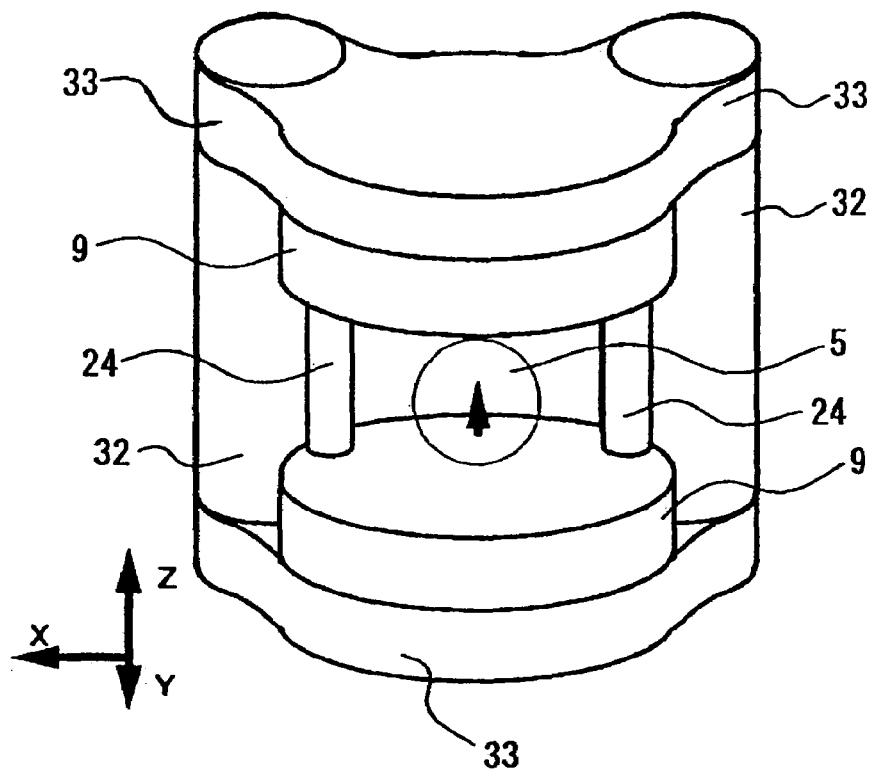
FIG. 1 is a perspective view of a superconductive magnet device according to the present invention.
Figure 2:
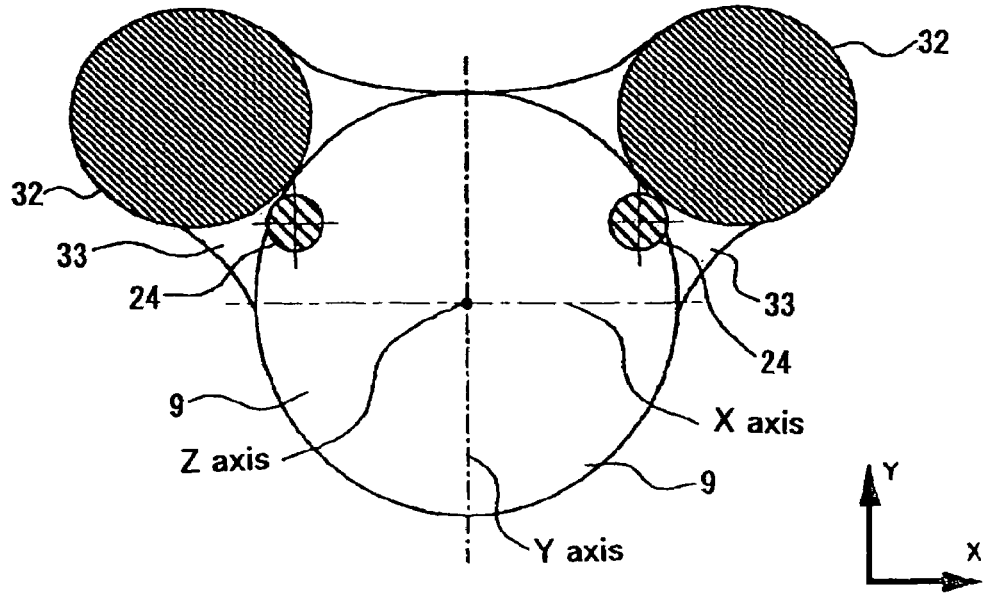
FIG. 2 is a cross-sectional view of the superconductive magnet device of FIG. 1 sectioned along a plane perpendicular to the z direction.

FIG. 1 is an overall perspective view of a superconductive magnet. FIG. 2 is a cross-sectional view of the superconductive magnet of FIG. 1 sectioned along a plane perpendicular to the z direction, and FIG. 3 is a cross-sectional view of the superconductive magnet sectioned along a plane parallel to the z direction of FIG. 1 and shows the configuration of gradient magnetic field coils and RF coils.

As shown in FIG. 1, the superconductive magnet unit has a structure wherein a pair of vacuum vessels 9, each of which includes a superconductive magnet, are disposed face to face so as to sandwich a certain space 5 (a measurement space where a subject is placed in the MRI apparatus). The upper and lower vacuum vessels 9 are interconnected by coupling conduits 24. The top and bottom of the whole assembly are surrounded by iron plates 33 and the upper and lower iron plates 33 are coupled magnetically by iron columns 32.

As shown in FIG. 1, the coupling conduits 24 of the vacuum vessels 9 and the iron columns 32 are disposed posterior the measurement space 5 (backside) with respect to the Y direction. This arrangement enables an operator to freely access a patient inserted into the measurement space 5 from the side and facilitates various treatments including IVMR. A patient situated in the measurement space 5 of the superconductive magnet unit has a broad horizontal field of view and feels less constricted and easier about being examined.

Figure 3:
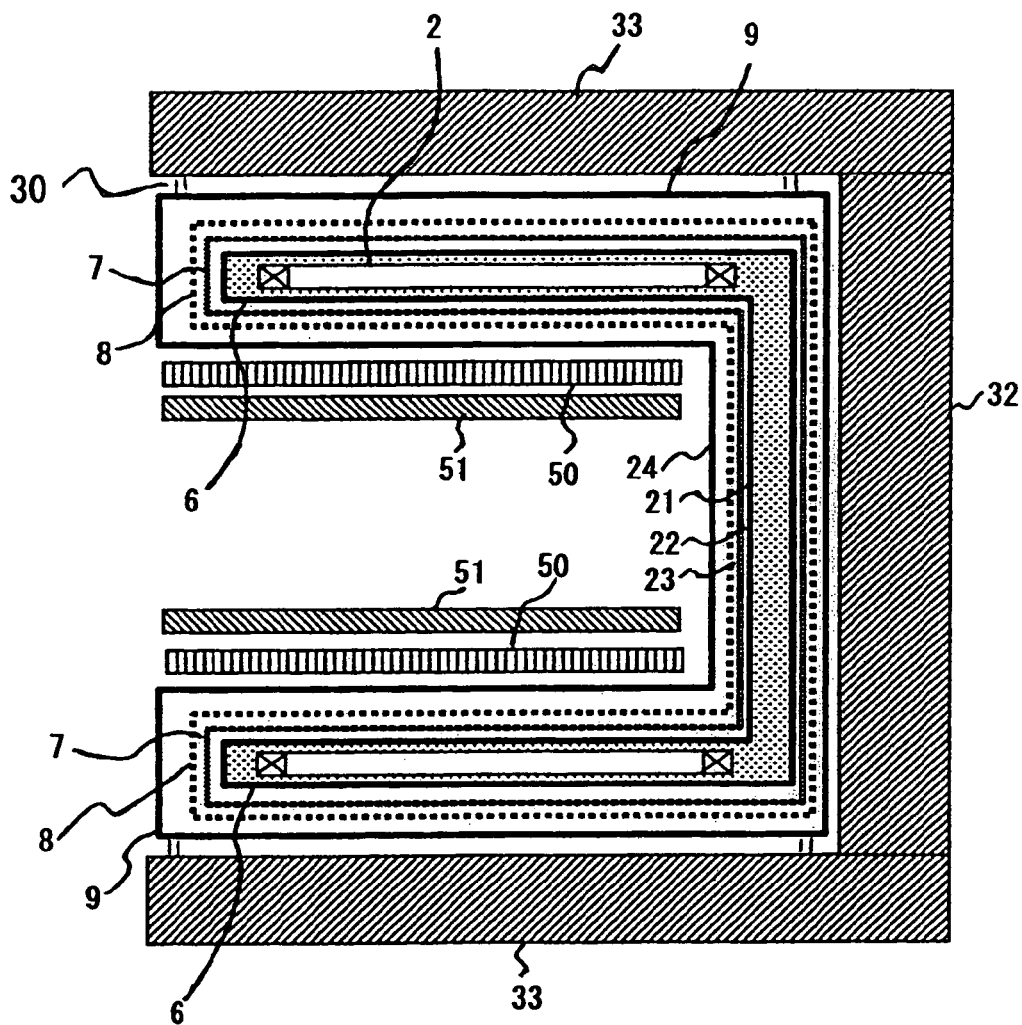
FIG. 3 is a cross-sectional view of the superconductive magnet device of FIG. 1 sectioned along a plane parallel to the z direction.

As shown in FIG. 3 in detail, inside the pair of vacuum vessels 9, there are provided a pair of upper and lower superconductive coils 2, a pair of upper and lower helium containers 6, a pair of upper and lower first heat shields 7, and a pair of upper and lower second heat shields 8.

Each of the upper and lower superconductive coils 2 is enclosed and supported in the helium container 6 as immersed in liquid helium. The upper and lower helium containers 6 are interconnected across a prescribed distance by coupling conduits 21. Each of the upper and lower helium containers 6 is surrounded by the first heat shield 7 and the second heat shield 8 located outside the first one. The coupling conduits 21 are surrounded by coupling conduits 22, 23, which respectively connect the upper and lower first heat shields and the upper and lower second heat shields across prescribed distances.

The upper and lower superconductive coils 2, helium containers 6, the first heat shields 7 and the second heat shields 8 are respectively contained in the upper and lower vacuum vessels 9. The coupling conduits 21 and coupling conduits 22, 23 are contained in the coupling conduits 24 which connect the upper and lower vacuum vessels 9 across a prescribed distance. The upper and lower vacuum vessels 9 are respectively fixed to the upper and lower iron plates 33 by bolts 30 at four positions. In addition, as shown in FIG. 3, the MRI apparatus using the superconductive magnet unit is further provided with gradient magnetic field coils 50 and RF coils 51 between the upper and lower vacuum vessels 9 so as to sandwich the measurement space 5.

In such a structure, the superconductive coils 2 generate a uniform and strong magnetic field in the measurement space 5 in the vertical direction. The superconductive coils 2 are immersed in liquid helium in the helium containers 6 and thereby kept cool and in a superconductive state.

The helium containers 6 are insulated from the exterior heat by the vacuum of the vacuum vessels 9, and cooled by the first heat shields 7 and the second heat shields 8 disposed outside the first heat shields, which are cooled to an extremely low temperature by a refrigerator (not shown in figures). Thus, evaporation of helium in the helium containers can be suppressed. Further, the coupling conduits 22, 23 in this structure are made of a highly heat-conductive material. Thus, a refrigerator is need not be provided for each of the upper and lower vacuum vessels 9. The first and second heat shields 7 and 8 are made of a material having excellent heat-conductivity and accordingly low electric resistance.

Magnetic shielding by the iron plates 33 is achieved by surrounding the upper and lower sides of the superconductive coils 2 with a ferromagnetic material and by forming a magnetic path (return path) for magnetic flux generated by the superconductive coils 2, thereby reducing leakage of the magnetic field and keeping it from spreading far away. While a material other than iron can be employed for the magnetic shield so far as it has ferromagnetic property, iron is generally preferred from the viewpoint of magnetic properties, cost and mechanical strength.

The magnet device of the present invention having the aforementioned basic structure is further provided with means for reducing asymmetrical eddy currents in the vacuum vessels and their coupling conduits and/or in the heat shields and their coupling conduits as described hereinafter. Embodiments of means for reducing asymmetrical eddy currents will now be explained.

Figure 4:
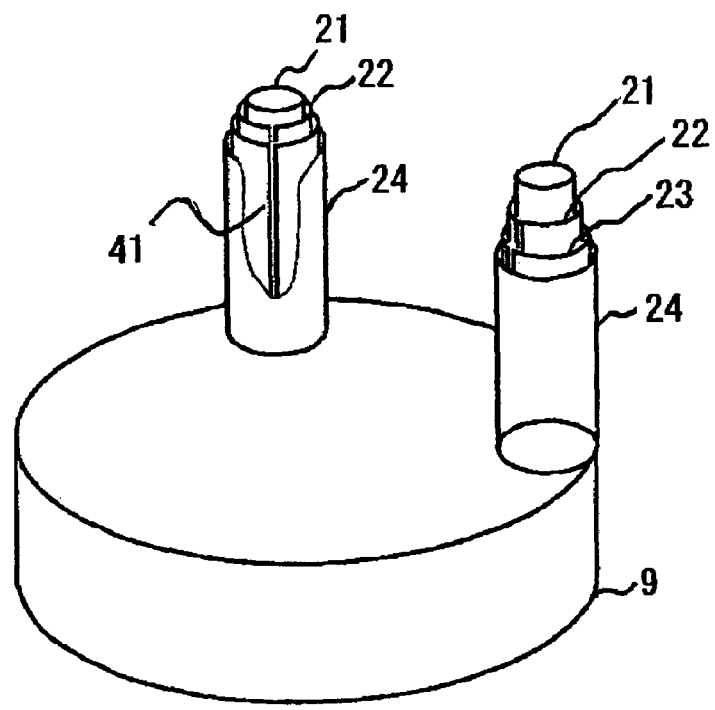
FIG. 4 is a perspective view of the lower portion of a vacuum vessel according to a first embodiment of the present invention.
Figure 5:
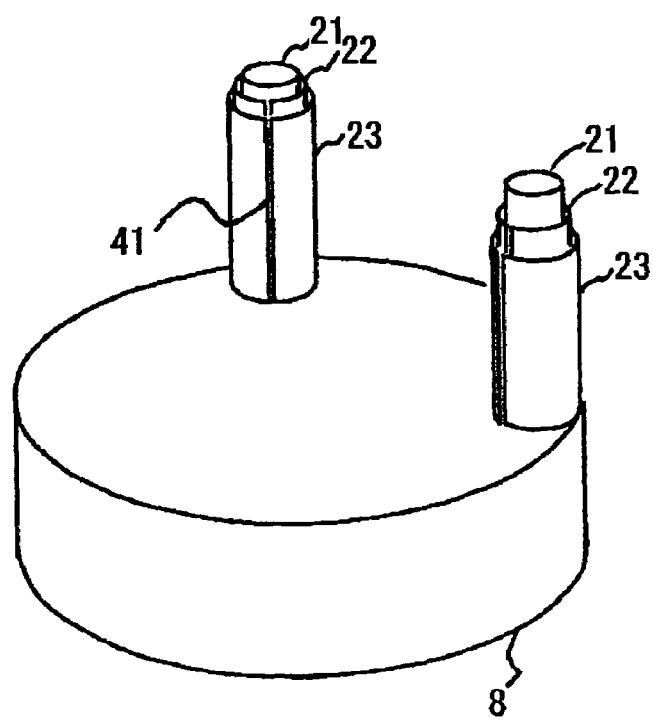
FIG. 5 is a perspective view of the lower portion of the interior of a vacuum vessel according to the first embodiment of the present invention.

FIG. 4 is a perspective view of the lower portion of a vacuum vessel 9 of the first embodiment, and FIG. 5 is a perspective view of the lower portion of the interior of the vacuum vessel 9. In this embodiment, the vacuum vessels 9 and coupling conduits 24 are made of a high electric-resistance material such as stainless steel so that a magnetic flux of the gradient magnetic field coil reaches the second heat shields 8. In other words, eddy currents are deliberately generated in the second heat shields 8 and coupling conduits 23 so as to suppress generation of eddy currents in the vacuum vessels 9 and coupling conduits 24.

Figure 9:
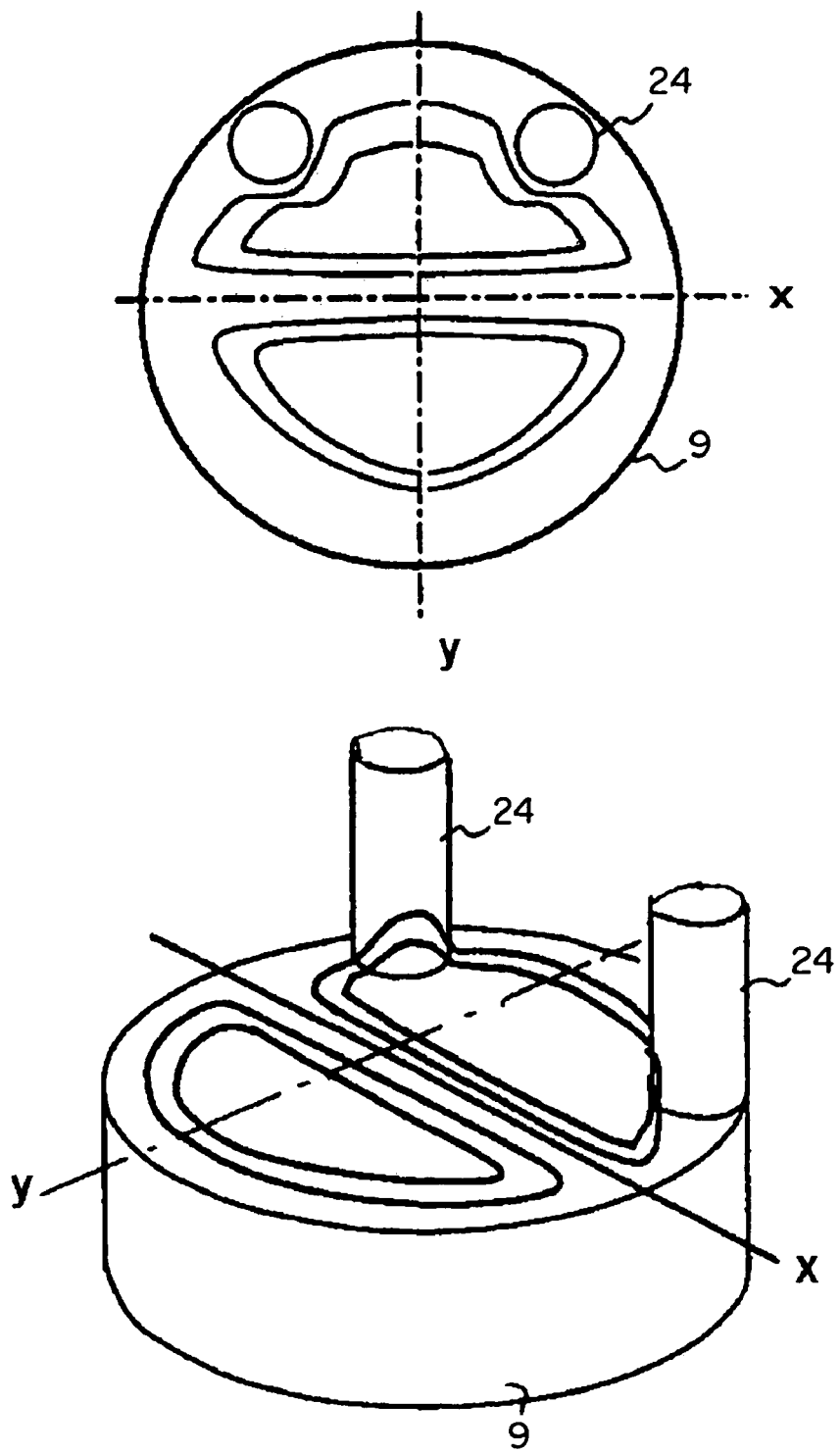
FIG. 9 shows generation of eddy currents in the conventional superconductive magnet.

However, in a case of only making the vacuum vessels 9 and coupling conduit 24 of a high electric-resistance material, eddy currents are generated in the second heat shields 8 and coupling conduits 23 asymmetrically with respect to the X-axis in the figure due to pulse-like change of the magnetic fields generated by the gradient magnetic field coils as explained for the vacuum vessels 9 shown in FIG. 9. These asymmetrical eddy currents degrade the produced images.

Accordingly, in this embodiment, a slit (cut portion) 41 is further provided in the vertical direction in each coupling conduit 22 connecting the upper and lower first heat shields 7 and in each coupling conduit 23 connecting the upper and lower first heat shields 8. The slits function as gaps in the circumferential direction of the coupling conduits 22, 23 to interrupt eddy current flow and reduce the asymmetry of the eddy currents. Since the density of eddy currents increases with increasing proximity to the measurement space 5, the slits are preferably provided nearest to the measurement space 5.

Figure 6:
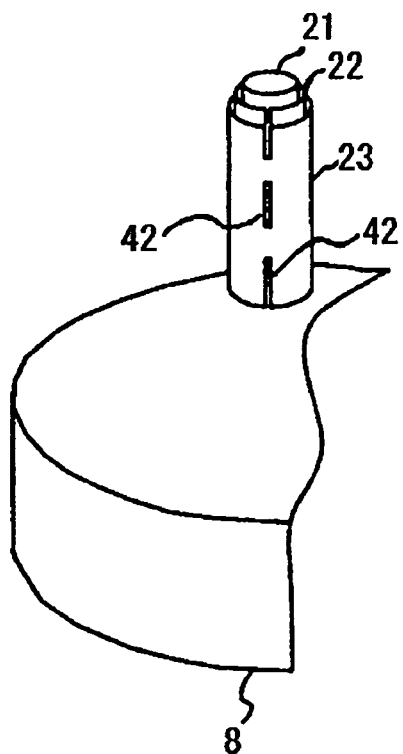
FIG. 6 is a perspective view of the lower portion of the interior of a vacuum vessel according to a second embodiment of the present invention.

While the slits 41 formed continuously in the vertical direction in this embodiment, each can be formed intermittently at several locations in the vertical direction as shown FIG. 6. Although continuous slits as shown in FIG. 4 are preferable in view of prevention of eddy currents, intermittent slits offer better strength and resistance to deformation of the first and second heat shields 7, 8. In this case, it is preferable that the slits 42 begin from at least the part of the coupling conduits 22, 23 that are connected to the heat shields so that eddy currents having the largest effect can be prevented.

Although the coupling conduits 22, 23 of the heat shields both have slits 41(42) in this embodiment, the slits 41(42) can, depending the required performance, be made in only the coupling conduits 23 of the second heat shields 8. The slits 41 (42) can have a shape other than the thin and long shape shown in the drawings. In addition, the slits 41(42) can be covered with an electrically insulating lid using an adhesive of high electric-resistance and high heat-conductivity in order to minimize deterioration of the strength of the coupling conduits due to the slits.

Another embodiment of the present invention will be explained next.

This embodiment solves the problem of asymmetrical eddy currents caused by the presence of holes that connect the space inside the coupling conduits with the space surrounded by the heat shield, i.e., the holes at the ends (top and bottom) of the coupling conduits in the superconductive magnet device of FIG. 3.

Figure 7:
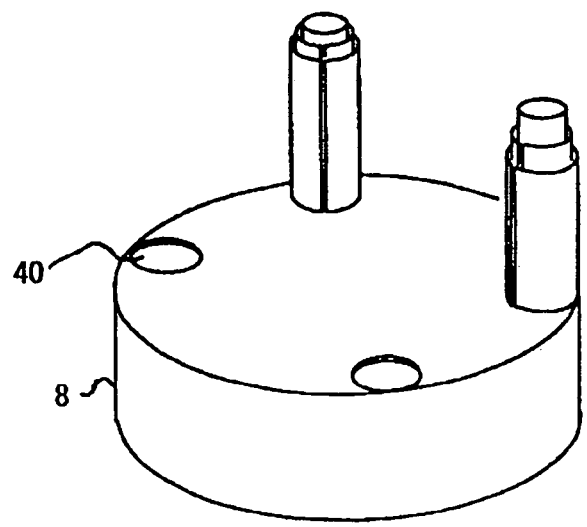
FIG. 7 is a perspective view of the lower portion of the interior of a vacuum vessel according to a third embodiment of the present invention.

In this embodiment, similarly to the aforementioned embodiment, the vacuum vessels 9 and the coupling conduits 24 are made of a high electric-resistance material. In addition, as shown in FIG. 7, holes 40 having the same shape as those of the holes at the ends of the two coupling conduits 23 are formed symmetrically to the holes at the ends of the coupling conduits 23 with respect to the X-axis (the center axis in the anterior and posterior direction) and the Y-axis (the center axis in the transverse direction) on the second heat shield 8. Provision of such holes reduces the asymmetry of the eddy currents generated in the surface of the second heat shield 8.

Figure 8:
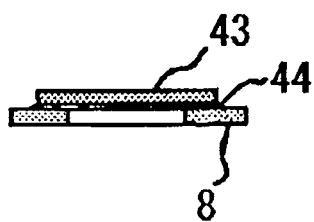
FIG. 8 is a cross-sectional view of hole and aluminum lid structures according to the third embodiment of the present invention.

As shown in FIG. 8, it is preferable in this embodiment for the holes 40 to be covered with aluminum lids 43 adhered to the second heat shield 8 using adhesive 44 of high electric-resistance and high heat-conductivity in order to reduce deterioration of heat shielding property owing to formation of the holes 40 in the second heat shield 8.

Although the drawings show the holes 40 formed in the second heat shield 8, the first heat shield 7 can also be provided with holes and lids.

Similarly to the embodiment of FIG. 4, the first and second heat shields may preferably have a continuous or intermittent slit in the vertical direction in this embodiment.

There has been explained hitherto, first and second embodiments of the present invention that employ vacuum vessels and vacuum vessel coupling conduits made of a high electric-resistance material and cope with asymmetrical eddy currents by means of heat shields and heat shield coupling conduits. These embodiments are effective from the viewpoint of maintaining a high degree of vacuum. The present invention also provides an alternative embodiment, which copes with the asymmetrical eddy currents by means of the vacuum vessels 9 and the coupling conduits 24.

Specifically, a third embodiment of the present invention employs the coupling conduits 24 of the vacuum vessels 9 having slits similar to those shown in FIGS. 5 and 6 and lids that cover the slits and are electrically insulated from other parts, while it employs the vacuum vessels 9 and coupling conduits 24 made of a low electric-resistance material. Such a slit establishes a region where current does not flow. Alternatively, it is possible to cope with the asymmetrical eddy currents by making only the coupling conduits 24 (but not the vacuum vessels 9) of a high electric-resistance material.

In a fourth embodiment, holes having the same shape as those of the holes connecting the inner space of the coupling conduit 24 to the inner space of the vacuum vessels 9 are further provided symmetrically with respect to both of the X-axis and Y-axis in order to further reduce the asymmetry of eddy currents. Lids of a high electric-resistance material are also provided to keep the vacuum vessels 9 sealed. In the fourth embodiment too, the coupling conduits 24 of the vacuum vessels 9 preferably have slits and slit lids.

It was explained in the foregoing that the superconductive magnet device of the present invention is applied to the apparatus shown in FIGS. 1–3. The magnet device of the present invention may be also applied to a static magnetic field generating magnet device of an active-shielding type having no iron plate 33, a static magnetic field generating magnet device equipped with pole pieces on the opposing surfaces and so forth. Further, the number and configuration of the coupling conduits 24 may be changed arbitrarily.

Figure 10:
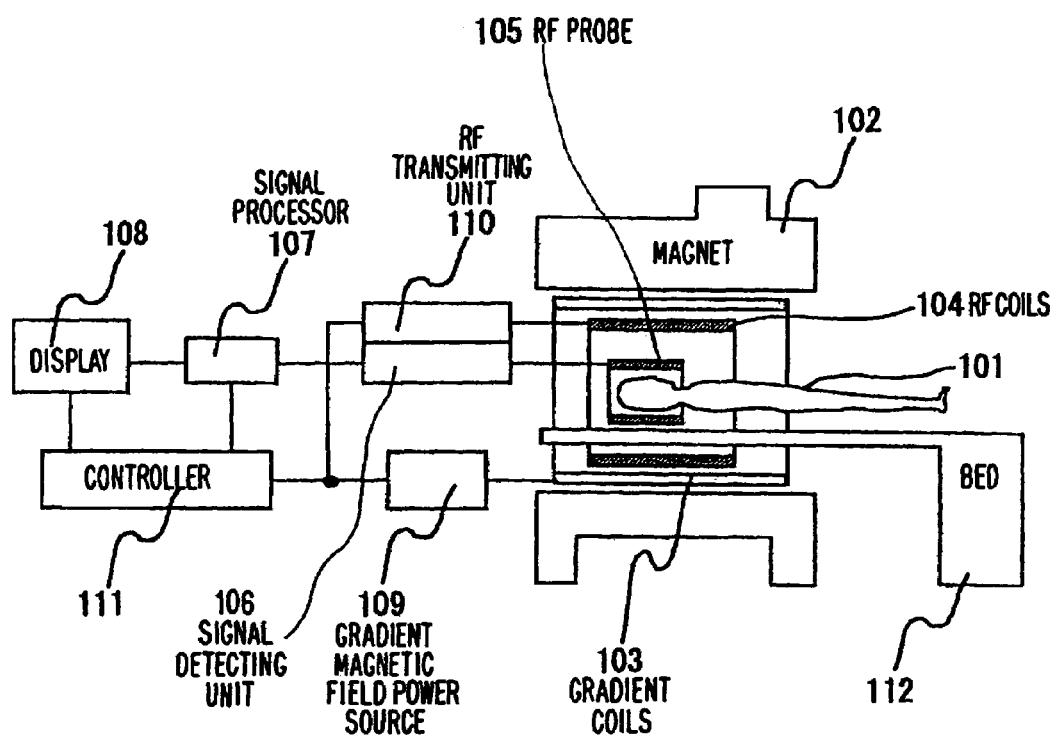
FIG. 10 is an overall view of an MRI apparatus to which the magnet device of the present invention is applied.

An overall configuration of an MRI apparatus which employs the magnet device of the present invention is shown in FIG. 10. This MRI apparatus comprises a magnet 102 for generating a static magnetic field in a space where a subject (patient) 101 is placed, gradient magnetic field coils 103 for generating gradient magnetic fields in the space, an RF coil 104 for generating a high frequency magnetic field in a measurement region of the subject, and an RF probe 105 for detecting NMR signals emitted from the subject 101. The apparatus further comprises a bed 112 for conveying the subject into the static magnetic field space. The magnet 102 is an open-type superconductive magnet device having an appearance as shown in FIG. 1, in which generation of asymmetrical eddy currents is suppressed.

The gradient magnetic field coils 103 includes gradient magnetic field coils for three directions X, Y, Z, each of which generates a gradient magnetic field in accordance with signals supplied by a gradient magnetic field power source 109. The RF coil 104 generates a high-frequency magnetic field in accordance with signals from an RF transmitting unit 110.

Signals from the RF probe 105 are detected by a signal detecting unit 106, processed by a signal processor 107 and further transformed to image signals by calculation. Images are displayed on a display 108.

The gradient magnetic field power source 109, RF transmitting unit 110 and signal detecting unit 106 are controlled by a controller 111 according to a pulse sequence determined to correspond to the measurement method and defines the timing of gradient magnetic field, RF magnetic field application and signal detection.

In such an MRI apparatus, when the gradient magnetic field coils are operated, eddy currents are generated within the vacuum vessels of the magnet 102 and coupling conduits thereof, and in the heat shields and the coupling conduits thereof. However, since the apparatus employs the magnet device capable of preventing the generation of asymmetrical eddy currents, artifacts caused by the asymmetrical eddy currents are suppressed and images of good quality can be produced.

The present invention has been explained with reference to a superconductive magnet device. The present invention can be applied to not only an MRI apparatus having a superconductive magnet but also a magnet device using a permanent magnet and an MRI apparatus using the same. In this case, columns for supporting a pair of magnets are made hollow and provided with slit portions to suppress the eddy currents. The slit portions may be continuous or intermittent in the longitudinal direction of the columns and may be covered with a high electric-resistance material to reinforce the strength of the supporting columns. In addition, when the material of the cover for covering the magnet is of low electric-resistance, recessed portions may be formed in the positions on the cover corresponding to holes to which the columns are attached so that asymmetry of the eddy currents generated in the cover can be cancelled.

The invention claimed is:

1. An open magnet device comprising:
   A pair of vacuum vessels disposed across a space in a vertical direction, wherein an object of inspection is insertable within the space between the pair of vacuum vessels,
   at least one cylindrical vacuum vessel coupling means for vertically connecting the inner spaces of the pair of vacuum vessels, and
   a pair of magnetic field generating means, one of the pair of the magnetic field generating means being disposed in one of the pair of vacuum vessels and another of the pair of magnetic field generating means being disposed in another of the pair of vacuum vessels, the pair of magnetic field generating means including a material having a superconductivity,
   wherein the pair of vacuum vessels and the vacuum vessel coupling means are made of a material having a high electric resistance.

2. The open magnet device of claim 1, further comprising:
   at least one pair of heat shields disposed inside the pair of vacuum vessels and cylindrical heat shield coupling means for vertically connecting the heat shields through spaces surrounded by the vacuum vessel coupling means,
   wherein the heat shield coupling means has at least one slit having a high electric-resistance property and extending continuously or intermittently in the vertical direction.

3. The open magnet device of claim 1, further comprising:
   at least one pair of heat shields disposed inside the pair of vacuum vessels and cylindrical heat shield coupling means for vertically connecting the heat shields through spaces surrounded by the vacuum vessel coupling means,
   wherein the heat shields have first holes opening into the inside of the heat shield coupling means and at least one of second holes and recesses having the same shape as those of the first holes in positions symmetrical to the first holes.

4. The open magnet device according to claim 1, wherein the at least one vacuum vessel coupling means have slit portions extending continuously or intermittently in the vertical direction and members configured for covering the slit portions which maintain the vacuum vessels in a vacuum state.

5. The open magnet device according to claim 1, wherein the vacuum vessels have first holes opening into the inside of the vacuum vessel coupling means and at least one of second holes and recesses having the same shape as those of the first holes in positions symmetrical to the first holes, the second holes of the vacuum vessels being covered with a high electric resistance material.

6. The open magnet device of claim 1 further comprising:
   at least one pair of heat shields disposed inside the pair of vacuum vessels and cylindrical heat shield coupling means configured for vertically connecting the heat shields through spaces surrounded by the vacuum vessel coupling means,
   wherein the heat shield coupling means have slit portions exhibiting a high electric resistance and extending continuously or intermittently in the vertical direction, and the heat shields have first holes opening into the inside of the heat shield coupling means and at least one of second holes and recesses having the same shape as those of the first holes in positions symmetrical to the first holes.

7. A magnetic resonance imaging apparatus configured for using an open magnet device according to any one of claims 1–6.

8. The open magnet device according to claim 1, configured for a magnetic resonance imaging apparatus,
   wherein the pair of magnetic field generating means include a pair of magnets disposed across the space in the vertical direction which generates a static magnetic field, and
   supporting columns which connect the magnets,
   wherein the supporting columns have slit portions extending continuously or intermittently in the vertical direction.

9. The open magnet device configured for a magnetic resonance imaging apparatus of claim 8, wherein the supporting columns are hollow.

10. The open magnet device configured for a magnetic resonance imaging apparatus of claim 9, further comprising:
    covers configured for the magnets, wherein the covers have holes opening into the inside of the columns and recesses having the same shape as those of the holes in positions symmetrical to the holes.

11. A magnetic resonance imaging apparatus including an open magnet device according to any one of claims 8–10.

12. The open magnet device according to any one of claims 3 and 6,
    wherein the second holes of the heat shields are covered with a high heat-conductive material via a material having high electric resistance and high heat-conductivity.

13. The open magnet device according to claim 2,
    wherein the slits are arranged at a position, which is nearest to a measurement space of the open magnet device.

14. The open magnet device according to any one of claims 4, 6 and 8,
    wherein the slit portions are arranged at a position which is nearest to a measurement space of the open magnet device.

15. The open magnet device according to claim 2,
    wherein the slits extend from at least a pad of the cylindrical heat shield coupling means at the connection thereof to the heat shields of the open magnet device.

16. The open magnet device according to claim 4, wherein the slit portions extend from at least a part of the cylindrical vacuum vessel coupling means at a connection thereof to the heat shields of the open magnet device.

17. The open magnet device according to claim 6, wherein the slit portions extend from at least a part of the cylindrical heat shield coupling means at a connection thereof to the heat shields of the open magnet device.

18. The open magnet device according to claim 8, wherein the slit portions extend from at least a part of the supporting columns at a connection thereof to the heat shields of the open magnet device.

19. The open magnet device of claim 1, further comprising:
    a pair of heat shields disposed inside the pair of the vacuum vessels, a pair of helium containers disposed inside the pair of the heat shields, at least one heat shield coupling conduit connecting the pair of heat shields, and at least one helium container coupling conduit disposed inside the heat shield coupling conduit and connecting the pair of helium containers.

20. The open magnet device of claim 1, wherein the vacuum vessel coupling means is disposed at one side of the space with respect to a plane including a central axis of a magnetic field extending in the vertical direction.

21. The open magnet device of claim 1, wherein a top and a bottom of the open magnet device are surrounded by an upper iron plate and lower iron plate, and the upper and lower iron plates are coupled magnetically by at least one iron column.

22. The open magnet device of claim 1 wherein the open magnet device is an active-shielding type open magnet device.

23. The open magnet device of claim 2, wherein the at least one pair of heat shields comprise a plurality of pairs of heat shields and a heat shield coupling conduit connecting the pair, and at least one of the heat shield coupling conduits has a slit.

* * * * *